US005286991A

United States Patent [19]
Hui et al.

[11] Patent Number: 5,286,991
[45] Date of Patent: Feb. 15, 1994

[54] CAPACITOR FOR A BICMOS DEVICE

[75] Inventors: Chihung (John) Hui, Cupertino; Roger Szeto, San Jose, both of Calif.

[73] Assignee: Pioneer Semiconductor Corporation, San Jose, Calif.

[21] Appl. No.: 935,955

[22] Filed: Aug. 26, 1992

[51] Int. Cl.$^5$ .................. H01L 27/02; H01L 21/44
[52] U.S. Cl. .................. 257/306; 257/311; 257/370; 257/379; 257/385; 257/532; 257/535; 437/191; 437/228; 437/233; 437/915; 437/919
[58] Field of Search ............ 257/306, 311, 370, 379, 257/385, 532, 535; 437/191, 228, 233, 915, 919

[56] References Cited

U.S. PATENT DOCUMENTS

| 3,955,269 | 5/1976 | Magdo et al. | 29/577 |
|---|---|---|---|
| 4,507,847 | 4/1985 | Sullivan | 29/576 B |
| 4,536,945 | 8/1985 | Gray et al. | 29/571 |
| 4,609,568 | 9/1986 | Koh et al. | 427/85 |
| 4,694,562 | 9/1987 | Iwasaki et al. | 437/57 |
| 4,764,480 | 8/1988 | Vora | 437/54 |
| 4,868,135 | 9/1989 | Ogura et al. | 437/31 |
| 5,005,072 | 4/1991 | Gonzalez | 257/534 |
| 5,107,321 | 4/1992 | Ilderem et al. | 357/43 |

OTHER PUBLICATIONS

Alvarez, A. R. et al. "2 Micron Merged Bipolar-CMOS Technology," Intl. Electron Device Technical Digest, 1984, pp. 761-764.
Bastani, B. et al. "Advanced One Micron BiCMOS Technology for High Speed 256K SRAMS," Proc. of Symp. on VLSI Tech. 1987 pp. 41-42.
Havemann, R. H. et al. "An 0.8 um 256K BiCMOS SRAM Technology," Intl. Electron Device Meeting Tech. Digest, 1987, pp. 841-843.
"BiCMOS Process Technology," BiCMOS Tech. and Applications, Chap.3, Edited by Antonio R. Alvarez, 1989, Kluner Academic Pub.

Primary Examiner—Edward Wojciechowicz
Attorney, Agent, or Firm—Townsend and Townsend Khourie and Crew

[57] ABSTRACT

The invention provides an improved BiCMOS device and a method of fabricating such a BiCMOS device which requires fewer process steps than known fabrication methods. In one embodiment, the invention provides a method of forming an interpoly capacitor in a BiCMOS device which maintains the thickness of the interpoly dielectric in the capacitor while a window is etched for the emitter in a bipolar transistor. The method includes the use of a thin polysilicon layer overlying the oxide layer, which protects the oxide from etching while the emitter window is etched.

14 Claims, 4 Drawing Sheets

CAPACITOR FOR A BICMOS DEVICE

BACKGROUND OF THE INVENTION

The present invention relates generally to semiconductor devices, and more specifically to fabrication methods for BiCMOS devices.

BiCMOS devices combine both bipolar and metal oxide semiconductor (MOS) transistors on a single integrated circuit. Bipolar and MOS devices each offer unique performance advantages which, when combined into a single package, produce a device with distinct advantages over either technology by itself. Such advantages are discussed in A. R. Alvarez, *BiCMOS Technology and Applications*, pp. 1-17, which is incorporated herein by reference.

Known methods for fabricating BiCMOS devices are described in, for example, U.S. Pat. No. 4,764,480 to Vora, U.S. Pat. No. 4,868,135 to Ogura et al. and in A. R. Alvarez, *BiCMOS Technology and Applications*, pp. 63-119, all of which are incorporated herein by reference for all purposes.

It is frequently desirable to fabricate BiCMOS devices with one or more capacitors formed on the substrate in addition to the bipolar and MOS transistors. Such capacitors commonly consist of a first polysilicon layer, a layer of oxide or other dielectric on the first polysilicon layer, and a second polysilicon layer on the oxide layer. This type of interpoly capacitor is particularly desirable because of its low parasitic capacitance.

A known method for fabricating an interpoly capacitor in a BiCMOS device is described in A. R. Alvarez, supra, at pp. 115-119. Alvarez describes a method wherein a first layer of polysilicon is formed on an oxide region of the substrate to form the capacitor, the same layer of polysilicon being formed on the MOS regions of the substrate to form gate electrodes. An interlevel dielectric (ILD) is formed over the first polysilicon region, using either oxide or oxide/nitride combination. A second polysilicon layer is then formed over the ILD layer to form the second terminal of the capacitor.

It should be noted that the device formed by the method disclosed in Alvarez does not utilize a polysilicon emitter contact for the bipolar transistor. In some advanced BiCMOS fabrication processes, a polysilicon emitter contact is formed over the bipolar base and an emitter diffused from the polysilicon emitter contact. An example of such a process is disclosed in Bastani, "Advanced One Micron BiCMOS Technology For High Speed 256K SRAMs", the full disclosure of which is incorporated herein by reference. Bastani describes a BiCMOS fabrication process wherein an oxide layer forming the interpoly dielectric is formed over the bipolar base. The oxide layer is then etched over a portion of the bipolar base to create an emitter window. A second polysilicon layer is then formed over the oxide layer, including in the emitter window, and the second polysilicon layer is etched to form the emitter contact.

It has been found that in forming a polysilicon emitter contact through an emitter window using a process such as that just described, it is extremely important to ensure the silicon surface of the base region in the emitter window remains free of oxide when the polysilicon layer is formed. Typically, over a short period in an oxygen-containing atmosphere, the silicon surface will tend to grow a thin layer of native oxide. Therefore, just before deposition of the second polysilicon layer, a very short etching step is conducted to remove this native oxide from the emitter window.

This short etching step, however, has led to difficulties when a capacitor like that disclosed in Alvarez is desired on a BiCMOS device with a polysilicon emitter contact like that of Bastani. To form such a device, an oxide layer is formed over the first polysilicon terminal of the capacitor as well as over the bipolar base, allowing both the interpoly dielectric of the capacitor as well as the emitter window to be formed from the same oxide layer. The polysilicon layer used to form the emitter contact may be used also to form the second polysilicon terminal of the capacitor.

However, such a process has suffered from the inability to prevent etching of the oxide layer of the interpoly capacitor during the short etching step to remove native oxide in the emitter opening before deposition of the second polysilicon layer. It is critical that the thickness of the interpoly dielectric be maintained within a certain range in order for the capacitor to perform properly. The etching step for removing the oxide in the emitter window will also tend to remove some oxide needed for the interpoly dielectric, making it difficult to control the interpoly dielectric thickness.

For these reasons, a method of fabricating an interpoly capacitor on a BiCMOS device is desired which allows formation of a polysilicon emitter contact, but which allows etching of the oxide in the emitter window for such a contact while maintaining the thickness of the interpoly dielectric layer for the capacitor. The method should minimize process steps, preferably allowing the same oxide layer used for the interpoly dielectric to be used for forming an emitter window in which the polysilicon emitter contact is formed.

SUMMARY OF THE INVENTION

The present invention provides an improved interpoly capacitor for a BiCMOS device and a method of fabricating such a capacitor which take advantage of the use a thin polysilicon layer to protect the interpoly dielectric during the etching of an emitter window. In a preferred embodiment, the capacitor is formed by the steps of forming a first polysilicon terminal on a first portion of a substrate laterally displaced from the bipolar transistor region and the MOS transistor region; forming a layer of oxide over at least the first polysilicon terminal and the bipolar base; forming a thin polysilicon layer over the layer of oxide; etching the thin polysilicon and oxide layers to form an emitter window over the bipolar base; and forming a second polysilicon terminal over the thin layer of polysilicon.

In BiCMOS fabrication processes, it is known to use a thin polysilicon layer deposited on the CMOS devices to protect the gate oxide from etching when the emitter contact is patterned and etched. Such processes are described in Alvarez et al., "2 Micron Merged Bipolar-CMOS Technology," and Havemann et al., "An 0.8 μm 256K BiCMOS SRAM Technology", as well as in U.S. Pat. No. 4,868,135 to Ogura et al., all of which are incorporated herein by reference. However, it has not been proposed heretofore to use such a thin polysilicon layer to protect the dielectric layer in an interpoly capacitor while the emitter window is etched.

Usually, the first layer of polysilicon is used to form the gate electrodes for the MOS transistors as well as the first polysilicon terminal of the capacitor. The oxide layer is preferably formed over the entire device, and the thin polysilicon layer deposited over the oxide layer. The emitter window is then masked, and the thin poly layer in the window is etched. The mask is removed, and the oxide in the emitter window is etched, the remaining portions of the oxide layer being protected by the thin poly layer. A third layer of polysilicon is then formed over the device and etched to form the emitter contact and the second terminal of the capacitor.

The invention further provides a capacitor formed using the above method, the capacitor comprising a first polysilicon layer, an oxide layer overlying the first polysilicon layer, a second polysilicon layer overlying the oxide layer and a third polysilicon layer overlying the second polysilicon layer, wherein the thickness of the second polysilicon layer is substantially less than the thickness of the first and third polysilicon layers. Preferably, the second polysilicon layer is less than one-half the thickness of the first and third layers, and is usually thinner than 1000 Å where the first and third layers are approximately 2000 Å to 4000 Å.

The present invention provides an interpoly capacitor with improved performance due to the controlled thickness of the interpoly dielectric during the fabrication process. The method of the present invention is superior to known fabrication techniques because it allows a high-performance interpoly capacitor and BiCMOS device to be formed with a minimum number of process steps. The method is particularly advantageous because of the controllability of the interpoly dielectric thickness during the step of etching the emitter window for formation of a polysilicon emitter contact in the bipolar transistor.

A further understanding of the nature and advantages of the invention may be realized by reference to the remaining portions of the specification and the drawings.

DESCRIPTION OF SPECIFIC EMBODIMENTS

Figure 1A:
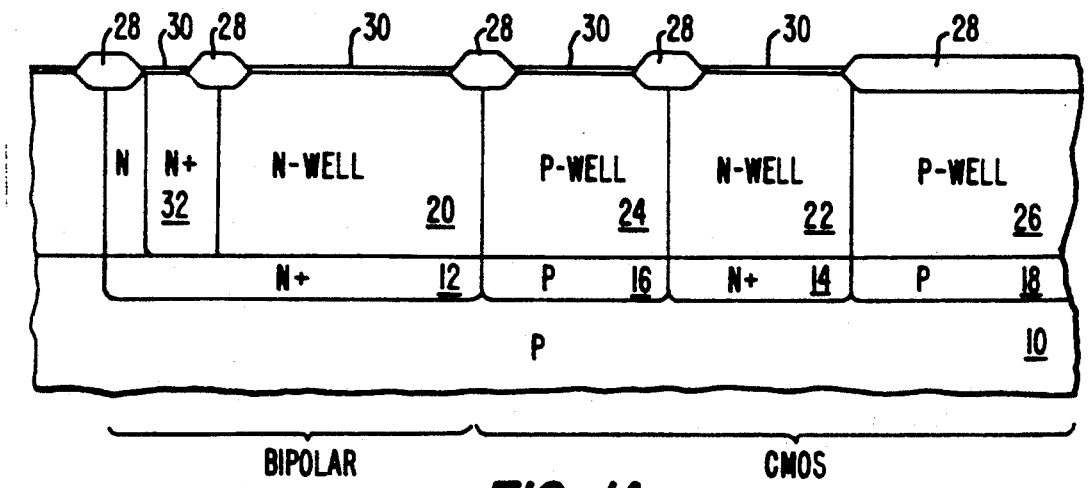
FIGS. 1A–1K are cross-sectional front views of a BiCMOS device fabricated according to the method of the present invention.

FIGS. 1A–1K illustrate the fabrication sequence in the method of the present invention. In FIG. 1A, N+ buried layers 12, 14 and P-type buried layers 16, 18 have been formed in a P-type substrate by known processes. Over buried layers 12–18, N-wells 20, 22 and P-wells 24, 26 have been formed from an epitaxial layer through selective implanting using known processes. After N-wells 20, 22 and P-wells 24, 26 are formed, oxide channel stops 28 along with a thin gate oxide layer 30 are formed, again by known methods. A deep N+ collector region 32 is then formed by an N-type implant. An exemplary method for forming the structure shown in FIG. 1A is described in Alvarez, "BiCMOS Technology and Applications, pp. 101–103.

Usually, the structure of FIG. 1A is fabricated by first forming on the substrate and implanting the N+ buried layer 12, 14 using SB or As, preferably at an energy of 60–120 KeV and a dose of $1-4 \times 10^{15}$. The N+ buried layer is then annealed, usually at 1000°–1200° C. for 10 hours. The P+ buried layer 16, 18 is then implanted, preferably using Boron at an energy of 30–40 KeV and a dose of $1-3 \times 10^{13}$. The P+ layer is then annealed usually at 1000° C. for about 1 hour, and a layer of epitaxial silicon is deposited on the structure to a depth of about 1–2 μm. A thin layer of oxide is formed over the epitaxial layer, and an N-type masked implant is performed, usually using phosphorous at 100–200 KeV and a dose of $1-5 \times 10^{12}$, forming N-wells 20, 22. A mask is formed and the P-well regions 24, 26 implanted, preferably with Boron at 100–200 KeV and a dose of $1-5 \times 10^{12}$. After the resist is stripped, a well drive-in step is performed, usually at 1000°–1100° C. for 1 to 4 hours. Nitride is then deposited, preferably to a thickness of 1500 Å, active device regions are patterned, and the Nitride etched in the field isolation regions. Channel stops are implanted using Boron, preferably at 30–40 KeV and a dose of $1-4 \times 10^{13}$. Field oxide regions are then grown, usually to a thickness of 5000–7000 Å to form channel stops 28. Nitride is then removed. After a punch-through mask and implant, preferably using Boron at 40–100 KeV, gate oxide 30 is grown over the structure.

Figure 1B:
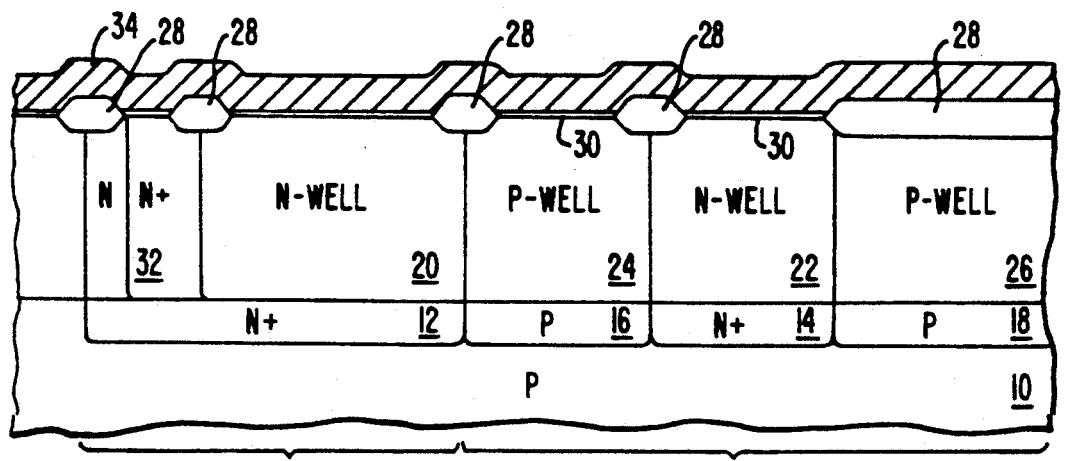

In FIG. 1B, a polysilicon layer 34 is formed over the surface of the device, preferably to a thickness of around 3000 Å–5000 Å. The polysilicon layer is diffusion doped using POCl$_3$.

Figure 1C:
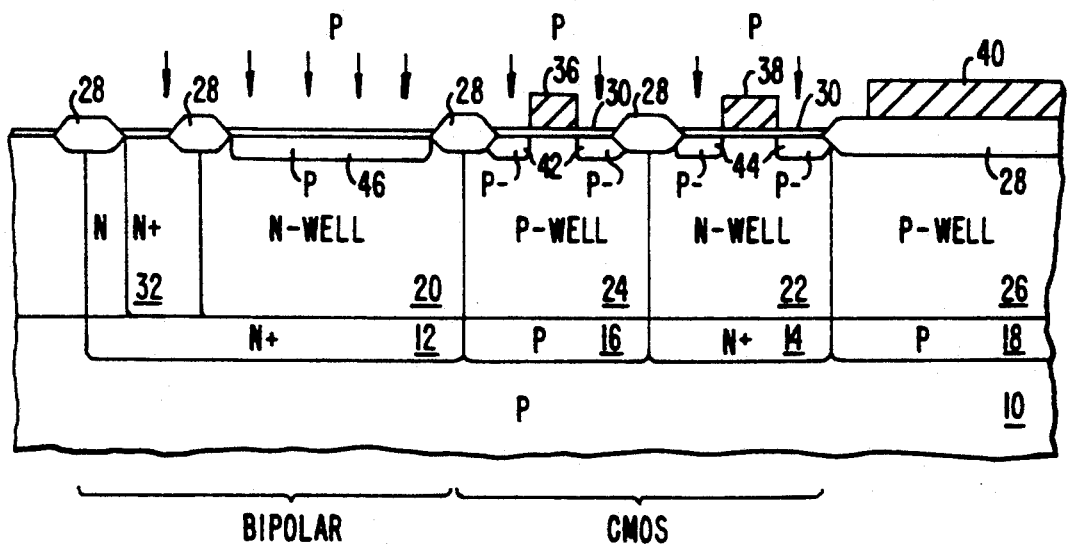

A mask is then formed over polysilicon layer 34 and the polysilicon layer 34 is etched to form gate electrodes 36, 38, as shown in FIG. 1C. In some embodiments, a portion of polysilicon layer 34 over P-well region 26 is masked for purposes of forming a poly-to-poly capacitor, as described more fully below.

A blanket P- implant is then performed over the entire structure, as shown in FIG. 1C. Preferably, the P-implant is performed with an energy of 25–60 KeV with a dosage of about $1-3 \times 10^{13}$. P- LDD regions 42, 44 and P-type base region 46 are thereby formed. It has been found that the energy and dosage of the P- implant is more critical in forming the bipolar base 46 than LDD regions 42, 44, the thickness and dopant concentration of base 46 having a significant effect upon the performance of the bipolar transistor. Therefore, the P-implant shown in FIG. 1C is performed with a dose and energy appropriate for forming bipolar base 46. The same dose and energy are used to implant LDD regions 42, 44, as it has been found that a P implant tailored for the base region 46 is suitable for forming LDD regions 42, 44.

Figure 1D:
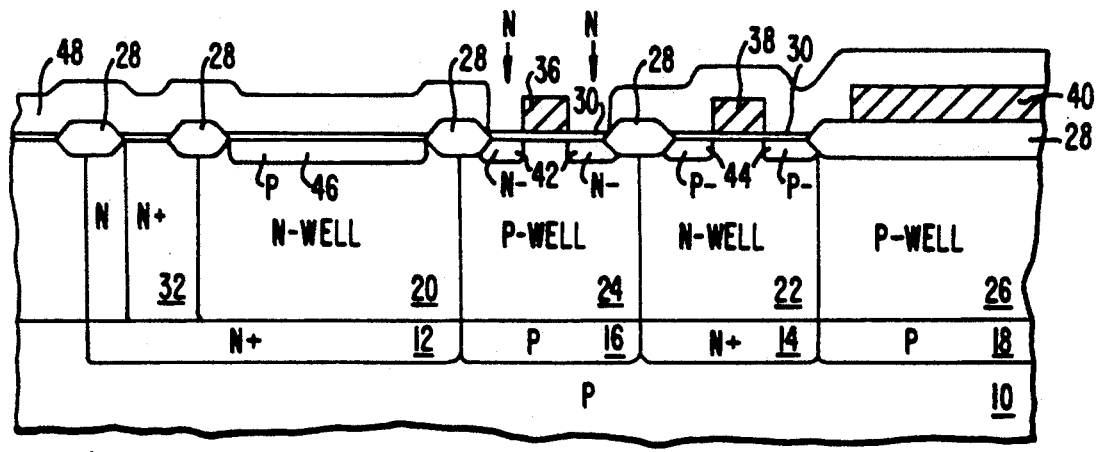

A layer of photoresist 48, shown in FIG. 1D, is formed over the surface of the device with the surface of gate oxide 30 over LDD regions 42 in the NMOS transistor exposed. An N- implant is then performed to produce N- LDD regions 42. Preferably, the implant is performed using phosphorous at a dose of $1-3 \times 10^{13}$ and an energy of 25–60 KeV.

Figure 1E:
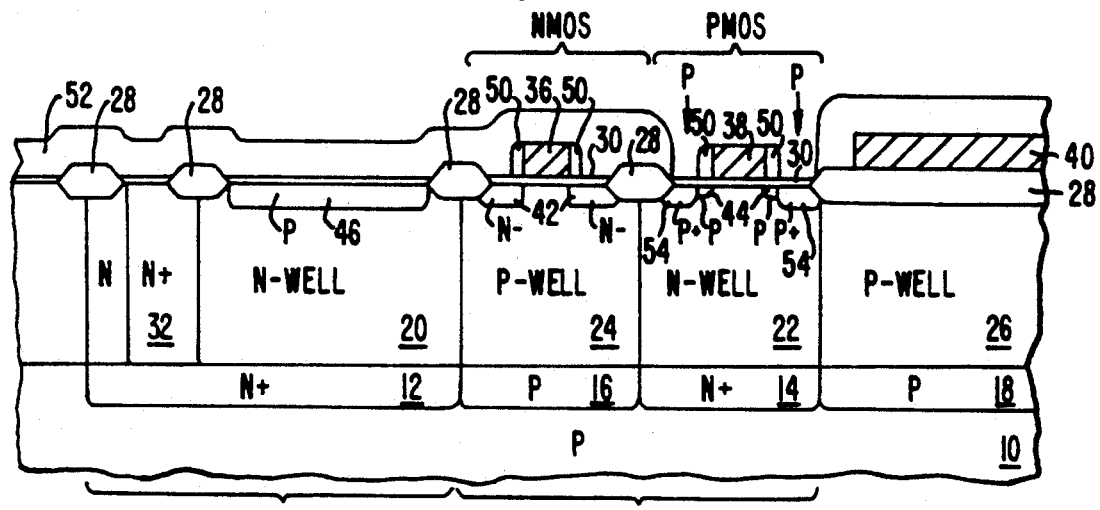

The photoresist 48 for the N- implant is then removed, and a layer of oxide deposited on the surface of the device, usually in a CVD reactor. Preferably, the oxide layer is deposited to a thickness of about 3,000 Å. The oxide layer is then selectively etched to produce sidewall spacers 50 adjacent polysilicon gate electrodes 36, 38, as shown in FIG. 1E. Preferably, the etch is performed anisotropically so as to leave portions of oxide along the vertical edges of gate electrodes 36, 38. This etch is performed with high selectivity to silicon, such that the etch does not reduce the thickness of base 46. In the past, the concern for the potential of etching base region 46 discouraged use of the method taught by the present invention. However, it has been found that the oxide/silicon selectivity of modern etch equipment is sufficient to maintain the necessary thickness of base region 46 during the etch of oxide spacers 50.

As shown in FIG. 1E, a layer of photoresist 52 is then formed over the surface of the device leaving the surface of the PMOS transistor exposed. Preferably, prior to forming photoresist layer 52, a layer of thin oxide, preferably approximately 100 Å in thickness, is grown over the active regions to protect the silicon surfaces from the photoresist. A P+ implant is then performed to create P+ source/drain regions 54. Preferably, this implant is performed using BF$_2$ or Boron at a dose of $1-4 \times 10^{15}$.

Figure 1F:
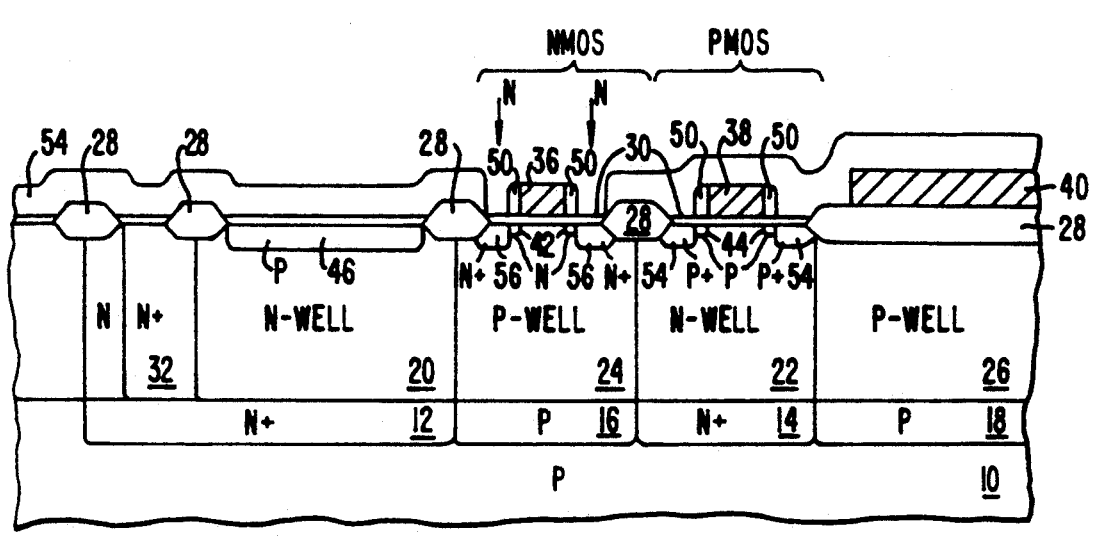

Photoresist layer 52 is then removed, and another photoresist layer 54 formed on the surface of the device leaving the surface of the NMOS transistor exposed, as shown in FIG. 1F. An N+ implant is then performed, preferably using arsenic or phosphorus at a dose of $1-6 \times 10^{15}$, forming N+ source/drain regions 56. Photoresist layer 54 is then removed from the structure.

Figure 1G:
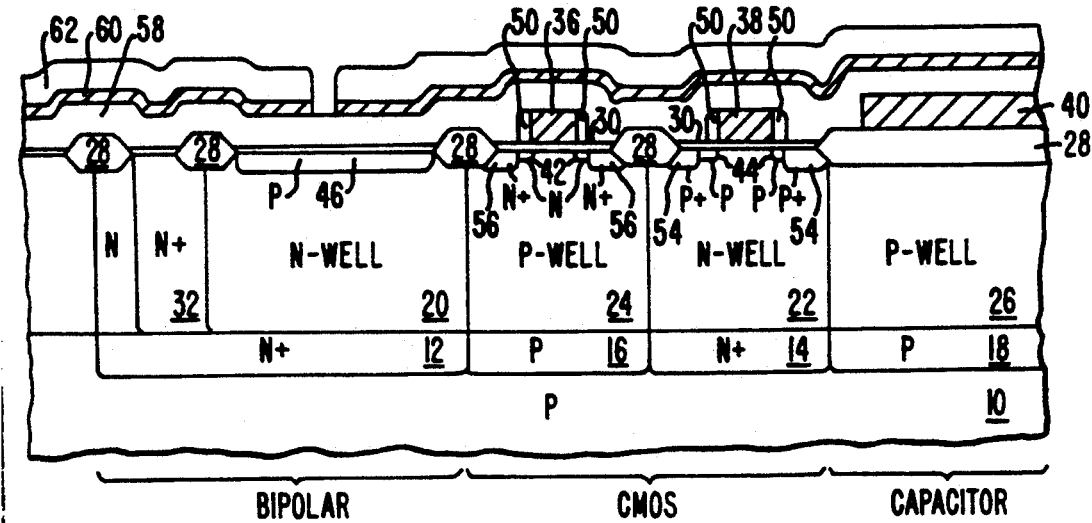
Figure 1H:
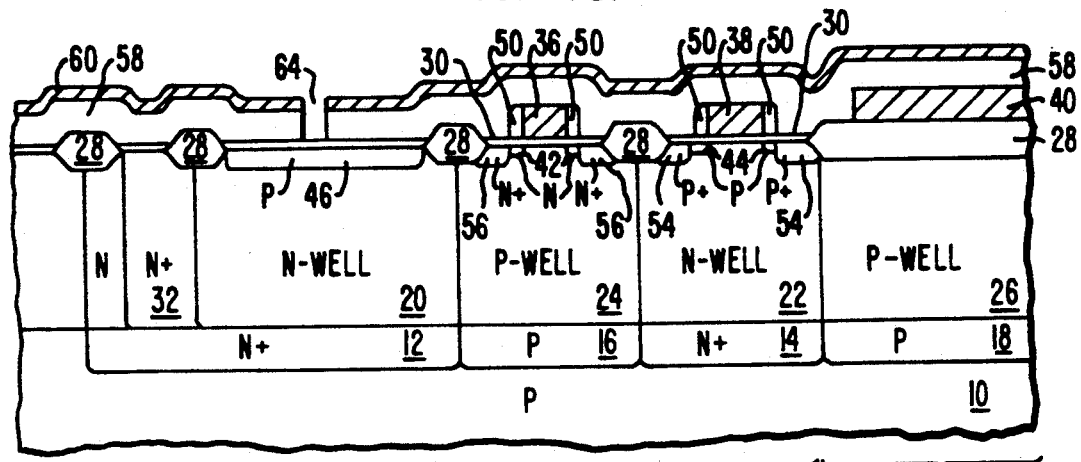
Figure 1I:
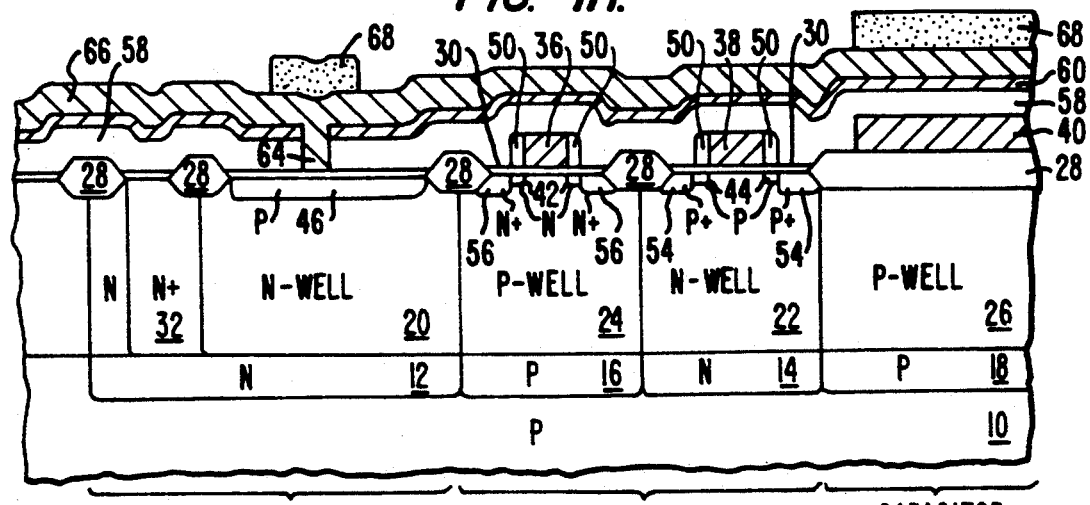
Figure 1J:
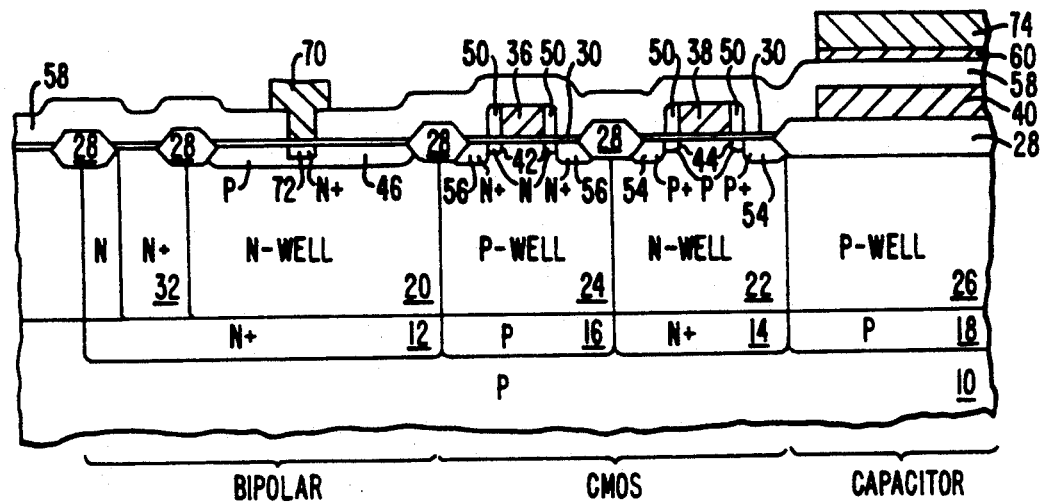

Referring now to FIG. 1G, a layer of oxide 58 is grown or deposited on the surface of the device, preferably to a thickness of about 500–3000 Å. Over oxide layer 58, a thin layer of polysilicon 60 is deposited, preferably having a thickness of about 700 Å. A layer of photoresist 62 is then formed over the thin poly layer 60, leaving an opening over base region 46 which will correspond to the emitter window in the oxide layer 58. Thin poly layer 60 is then etched, leaving the structure shown in FIG. 1G. Photoresist layer 62 is then removed, and oxide layer 58 etched to create an emitter window 64, as shown in FIG. 1H. During this step of etching emitter window 64, thin poly layer 60 serves to protect the oxide layer 58 over poly layer 40 in the capacitor region of the device. Maintaining the oxide layer 58 to the sufficient thickness over poly layer 40 is critical to the performance of the capacitor.

A third polysilicon layer 66 is then formed over the device, including in emitter window 64 overlying base 46. Preferably, a short oxide etching dip is conducted just before the third polysilicon layer 66 is deposited to remove any native oxide in the emitter window. During this step, thin poly layer 60 again protects oxide layer 58. A mask 68 is then formed over polysilicon layer 66 protecting the areas which eventually will become the emitter contact for the bipolar transistor and the second polysilicon layer of the capacitor. The polysilicon layers 66, 60 are then etched, leaving the structure shown in FIG. 1J.

Polysilicon emitter contact 70 overlies base 46 in the bipolar transistor. An emitter 72 is diffused from emitter contact 70. A poly-to-poly capacitor has been formed, comprising a first thick polysilicon layer 40, oxide layer 58 overlying layer 40, thin polysilicon layer 60 on the oxide layer and second thick polysilicon layer 74 over thin polysilicon layer 60.

Figure 1K:
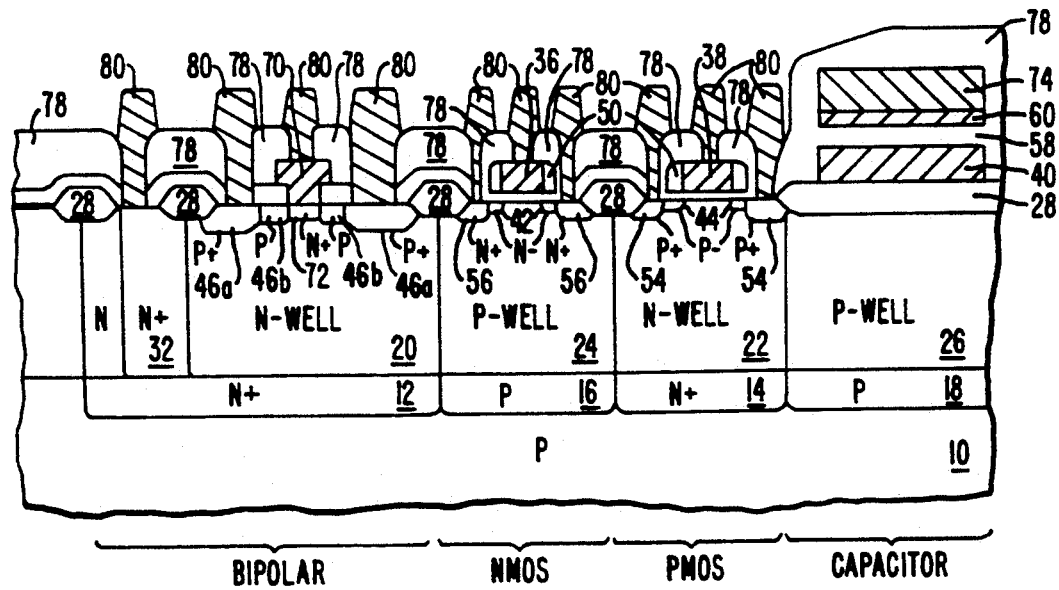

The completed BiCMOS device constructed according to the method of the present invention is shown in FIG. 1K. In the remaining fabrication steps, a BPSG layer 78 is deposited over the surface of the device to a thickness of about 6000–8000 Å, and an anneal performed, preferably at 900° C. for approximately 30 minutes. A mask is then formed over the BPSG layer 78, leaving areas exposed where contacts for the collector, base, and emitter of the bipolar transistor and the source/drain of the MOS transistors will be formed. An etch is then performed removing the BPSG layer as well as oxide layer 58 in the areas where the contacts will be formed. A contact reflow is then performed, usually at 900° C. for about 30 minutes in a nitrogen-/oxygen atmosphere. Contact metal is then deposited, which usually consists of an aluminum-silicon alloy. The metal is masked and etched to form contacts 80 for the collector, base and emitter of the bipolar transistor and for the gate and source/drain regions of the MOS transistors.

While the invention has been described with reference to specific embodiments, various alternatives, modifications, and equivalents may be used. Therefore, the above description should not be taken as limiting the scope of the invention which is defined by the appended claims.

What is claimed is:

1. A method of forming a capacitor for a BiCMOS device on a semiconductor substrate, the substrate including a bipolar transistor region and at least a first MOS transistor region, the method comprising the steps of:

forming a first polysilicon terminal on an insulative region over a first portion of the substrate laterally displaced from the bipolar transistor region and the MOS transistor region;

forming a layer of oxide over at least the first polysilicon terminal and the bipolar transistor region of the substrate;

forming a thin polysilicon layer over the layer of oxide;

etching the thin polysilicon layer to form an exposed area of the oxide layer over the bipolar transistor region;

etching the oxide layer in the exposed area to form an emitter window over the bipolar transistor region;

dipping the exposed area to remove any native oxide off of the emitter window; and forming a second polysilicon terminal over the thin layer of polysilicon just after the dipping step, wherein the thin polysilicon layer and the second polysilicon terminal are electrically insulated from the first polysilicon terminal.

2. The method according to claim 1 wherein the step of forming a first polysilicon terminal comprises:

forming a first layer of polysilicon on at least the MOS region and on the first portion of the substrate; and selectively etching the first layer of polysilicon to form a gate electrode on the MOS transistor region and the first polysilicon terminal on the first portion of the substrate.

3. The method according to claim 1 wherein the step of oxide etching comprises selectively etching the oxide layer over the emitter window, the emitter window being substantially free of oxide.

4. The method according to claim 3 wherein the step of forming the second polysilicon terminal further comprises forming an emitter contact in the emitter window, the emitter contact formed by the steps of:

forming a third polysilicon layer over the thin layer of polysilicon and in the emitter window; and selectively etching the third polysilicon layer to form the second polysilicon terminal over the first portion of the substrate and the emitter contact in the emitter window.

5. The method according to claim 1 wherein the thin layer of polysilicon is formed to a thickness of less than one-half the thickness of the first polysilicon terminal.

6. The method according to claim 5 wherein the thin layer of polysilicon is formed to a thickness of less than 1000 Angstroms.

7. A capacitor for a BiCMOS device on a substrate, the capacitor comprising:
a first polysilicon layer on an insulative region over a first portion of the substrate;
an oxide layer over the first polysilicon layer;
a second polysilicon layer over the oxide layer; and
a third polysilicon layer over the second polysilicon layer, wherein the second polysilicon is substantially thinner than the first and third polysilicon layer and further wherein the second and third polysilicon layers are electrically insulated form the first polysilicon layer.

8. A capacitor as in claim 7 wherein the second polysilicon layer is less than one-half the thickness of either the first or third polysilicon layers.

9. A capacitor as in claim 8 wherein the second polysilicon layer is less than 1000 Angstroms in thickness.

10. A capacitor for a BiCMOS device on a substrate, the substrate including a bipolar region and an MOS region, the capacitor formed by the steps of:
forming a first layer of polysilicon on at least an insulative region over a first portion of the substrate laterally displaced from the bipolar and MOS regions;
forming a layer of oxide over at least the bipolar region and the first portion of the substrate, the oxide layer covering the first layer of polysilicon;
forming a second layer of polysilicon on the layer of oxide over at least the bipolar region and the first portion of the substrate;
etching the thin polysilicon layer to form an exposed area of the layer of oxide over the bipolar transistor region;
etching the oxide layer to form an emitter window over the bipolar region;
dipping the exposed area to remove any native oxide off of the emitter window; and
forming a third layer of polysilicon over the second layer of polysilicon just after the dipping step, wherein the second layer is substantially thinner than the first and third layers and wherein the second and third layers of polysilicon are electrically insulated form the first layer of polysilicon.

11. A capacitor according to claim 10 wherein the step of forming a first polysilicon layer further comprises:
forming the first layer of polysilicon on at least the MOS region of the substrate; and
selectively etching the first layer of polysilicon to form a gate electrode on the MOS region and a first capacitor terminal on the first portion of the substrate.

12. The capacitor according to claim 10 wherein the step of oxide etching comprises selectively etching the oxide layer over the emitter window, the emitter window being substantially free of oxide.

13. The capacitor according to claim 12 wherein the step of forming the third polysilicon layer further comprises forming an emitter contact in the emitter window, the emitter contact formed by the steps of:
forming the third polysilicon layer in the emitter window; and
selectively etching the third polysilicon layer to form a second capacitor terminal over the first portion of the substrate and the emitter contact in the emitter window.

14. A BICMOS device having at least a capacitor and a bipolar transistor formed in a substrate, wherein the capacitor comprises:
a first polysilicon terminal on an insulative region over a first portion of the substrate;
an oxide layer over the first polysilicon terminal;
a thin polysilicon layer over the oxide layer; and
a second polysilicon terminal over the thin polysilicon layer, the second polysilicon terminal being formed from a thick polysilicon layer deposited over the substrate and selectively etched, the thin polysilicon layer being substantially thinner than the first and second polysilicon terminals and the second polysilicon terminal being electrically insulated from the first polysilicon terminal;
and wherein the bipolar transistor comprises:
a base region formed in a second portion of the substrate laterally displaced from the first portion;
an emitter formed in a third portion of the substrate adjacent the base region; and
a polysilicon emitter contact overlying the emitter in electrical contact therewith, the emitter contact being formed from the thick polysilicon layer used to form the second polysilicon terminal of the capacitor.

* * * * *